United States Patent
Jiao et al.

(10) Patent No.: US 10,886,725 B2
(45) Date of Patent: Jan. 5, 2021

(54) SWITCHING POWER SUPPLY, OVER-TEMPERATURE CONTROL AND PROTECTION METHOD, AND POWER CONTROL METHOD

(71) Applicant: Delta Electronics (Shanghai) CO., LTD, Shanghai (CN)

(72) Inventors: Dezhi Jiao, Shanghai (CN); Baohua Wang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 568 days.

(21) Appl. No.: 15/869,644

(22) Filed: Jan. 12, 2018

(65) Prior Publication Data

US 2018/0261997 A1    Sep. 13, 2018

(30) Foreign Application Priority Data

Mar. 10, 2017  (CN) .......................... 2017 1 0142104

(51) Int. Cl.
*H02H 5/04*    (2006.01)
*G01K 7/24*    (2006.01)
(Continued)

(52) U.S. Cl.
CPC .............. *H02H 5/042* (2013.01); *G01C 9/02* (2013.01); *G01K 3/005* (2013.01); *G01K 7/24* (2013.01);
(Continued)

(58) Field of Classification Search
CPC .... H02M 2001/327; H02M 1/32; H02M 1/36; H03K 17/08–98; G01K 7/24;
(Continued)

(56) References Cited

U.S. PATENT DOCUMENTS 6,484,109 B1  11/2002  Lofall
7,142,125 B2  11/2006  Larson et al.
(Continued)

FOREIGN PATENT DOCUMENTS

CN  102782512 A  11/2012
CN  104029643     9/2014
(Continued)

OTHER PUBLICATIONS

The CN1OA issued Jul. 16, 2019 by the CNIPA.
The 1st office action issued in the counterpart TW application No. 106124301 dated Mar. 2, 2018, by the TIPO.

*Primary Examiner* — Jared Fureman
*Assistant Examiner* — Christopher J Clark
(74) *Attorney, Agent, or Firm* — Yunling Ren

(57) ABSTRACT

The present disclosure relates to a switching power supply, an over-temperature control and protection method, and a power control method. The switching power supply includes: a converter module including at least one main power switch; a direction detection module configured to obtain installation direction information of the switching power supply; and a process module configured to perform a preset operation in accordance with the installation direction information of the switching power supply. The present disclosure may realize power control of the switching power supply and meet over-temperature protection requirements under various installation directions.

14 Claims, 12 Drawing Sheets

(51) Int. Cl.
*G01P 15/18* (2013.01)
*H02M 1/32* (2007.01)
*H03K 17/08* (2006.01)
*G01K 3/00* (2006.01)
*G01C 9/02* (2006.01)

(52) U.S. Cl.
CPC .............. *G01P 15/18* (2013.01); *H02M 1/32* (2013.01); *H02M 2001/327* (2013.01); *H03K 2017/0806* (2013.01)

(58) Field of Classification Search
CPC ........ G01P 15/00–18; H02H 5/04–048; H02H 6/005; H02H 7/10–127
See application file for complete search history.

(56) References Cited

U.S. PATENT DOCUMENTS

| | | | |
|---|---|---|---|
| 7,979,235 B2* | 7/2011 | Pasolini | G11B 19/042 702/141 |
| 2010/0259889 A1 | 10/2010 | Chen et al. | |
| 2011/0278918 A1 | 11/2011 | Shindo et al. | |
| 2012/0016610 A1* | 1/2012 | Lan | G01K 7/24 702/65 |
| 2016/0172993 A1* | 6/2016 | Yuasa | H02P 29/68 318/504 |
| 2016/0355189 A1 | 12/2016 | Lin et al. | |
| 2017/0133658 A1* | 5/2017 | Zhang | H01M 10/425 |
| 2018/0086207 A1* | 3/2018 | Mito | B60L 3/04 |

FOREIGN PATENT DOCUMENTS

| | | |
|---|---|---|
| CN | 105049583 A | 11/2015 |
| CN | 205584024 U | 9/2016 |
| TW | 201224730 A | 6/2012 |
| TW | 201313510 A | 4/2013 |

* cited by examiner

SWITCHING POWER SUPPLY, OVER-TEMPERATURE CONTROL AND PROTECTION METHOD, AND POWER CONTROL METHOD

CROSS-REFERENCE TO RELATED APPLICATIONS

This application claims priority to Chinese Patent Application No, 201710142104.X, filed Mar. 10, 2017, the entire contents of which are incorporated herein by reference.

TECHNICAL FIELD

The present disclosure generally relates to power electronics, and more particularly, to a switching power supply, an over-temperature control and protection method and a power control method.

BACKGROUND

At present, switching power supply products are developing to the direction of high efficiency, high power density and high reliability. At the same time, many switching power supply products need to control the temperature of all kinds of electronic components inside the switching power supply products through external forced cooling measures such as air cooling or water cooling, so as to meet the reliability and safety requirements. However, on the one hand, external cooling measures can reduce system reliability and service life, and may cause noise interference. Therefore, more and more applications require that switching power supplies can work under the condition of natural heat dissipation, and this imposes higher requirement on the heat dissipation capability of the switching power supplies. On the other hand, as shown in FIG. 1, a switching power supply product may be installed in six space directions along X, Y and Z axes under varied applications, different installations are associated with different heat dissipation conditions, and existing solutions cannot meet the power control and over-temperature protection requirements of the switching power supply under different installation directions.

Therefore, it is necessary to provide a switching power supply to satisfy the power control requirements in all installation directions.

It is to be noted that the information disclosed in the above-mentioned background section is for the purpose of reinforcing the understanding of the background of the present disclosure and may therefore include information that does not constitute prior art known to those of ordinary skill in the art.

SUMMARY

An objective of the present disclosure is to provide a power supply, an over-temperature control and protection method and a power control method, so as to solve to some extent one or more of the problems caused by the limitations and defects in related arts.

According to an aspect of embodiments of the present disclosure, there is provided a switching power supply, including:

a converter module including at least one main power switch;

a direction detection module configured to obtain installation direction information of the switching power supply; and a process module configured to perform a preset operation in accordance with the installation direction information of the switching power supply.

According to an exemplary embodiment of the present disclosure, the switching power supply further includes:

a sampling module configured to sample the temperature of a detection point in the switching power supply;

the process module is electrically coupled with the sampling module and the direction detection module, and the process module includes:

an inquiry unit configured to obtain a temperature threshold value corresponding to the installation direction information of the switching power supply from a mapping relationship between installation direction information and temperature threshold values;

a comparison unit configured to compare the temperature sampled by the sampling module with the temperature threshold value obtained by the inquiry unit; and a communication unit configured to determine whether to start an over-temperature protection based on a comparison result of the comparison unit and send a determination result signal to the converter module.

According to another aspect of embodiments of the present disclosure, there is provided an over-temperature control and protection method, applied in a switching power supply; the switching power supply includes a direction detection module, a sampling module and a process module. The over-temperature control and protection method includes:

sampling, by the sampling module, the temperature of a detection point in the switching power supply;

obtaining, by the direction detection module, installation direction information of the switching power supply;

obtaining a temperature threshold value corresponding to the installation direction information of the switching power supply from a mapping relationship between installation direction information and temperature threshold values in accordance with the installation direction information;

comparing the sampled temperature with the obtained temperature threshold value; and determining whether to start an over-temperature protection according to a comparison result.

In the switching power supply according to embodiments of the present disclosure, the direction detection module obtains the installation direction information of the switching power supply, and preset operations are performed according to the obtained installation direction information. On the one hand, the installation direction information of the switching power supply can be obtained by the direction detection module when the installation direction of the switching power supply changes; on the other hand, the preset operations are performed according to the obtained installation direction information, and thus the switching power supply can meet the power control and over-temperature requirements in all installation directions.

It should be understood that both the foregoing general description and the following detailed description are exemplary and explanatory only and are not intended to limit the scope of the present disclosure.

BRIEF DESCRIPTION OF THE DRAWINGS

The drawings, which constitute a part of this specification, are incorporated in and, show embodiments consistent with the present disclosure, and, together with the description, serve to explain the principles of the present disclosure. It will be apparent that the drawings in the following description are merely examples of the present disclosure.

DETAILED DESCRIPTION

Example implementations will be described in farther detail with reference to the accompanying drawings. The example implementation, however, may be embodied in various forms, and should not be construed as being limited to the implementations described herein. The described features, structures or characters may be combined in one or more embodiments in any suitable manner. In the following description, numerous specific details are provided so as to allow a full understanding of the embodiments of the present disclosure. However, those skilled in the art will recognize that the technical solutions of the present disclosure may be implemented without one or more of the specific details, or other methods, components, materials and so on may be used. In other instances, well-known technical solutions are not shown or described in detail to avoid obscuring aspects of the present disclosure.

In addition, the drawings are merely illustrative of the present disclosure and are not drawn based on actual scale. The same or similar reference signs represent the same or similar elements and repeated descriptions thereof will be omitted. Some block diagrams represent functional entities and are not necessarily corresponding to physically or logically independent entities. The functional entities can be realized in software form, or may be implemented in one or more hardware modules or integrated circuits, or in different networks and/or process devices and/or micro-controllers.

The application of switching power supplies is limited by the temperature-resistance capability of electronic components. In special application occasions such as medical fields, temperature protection is necessary to ensure that the temperature of electronic components cannot exceed their own temperature thresholds under any normal working conditions or abnormal conditions such as over-temperature, or overload.

Figure 2:
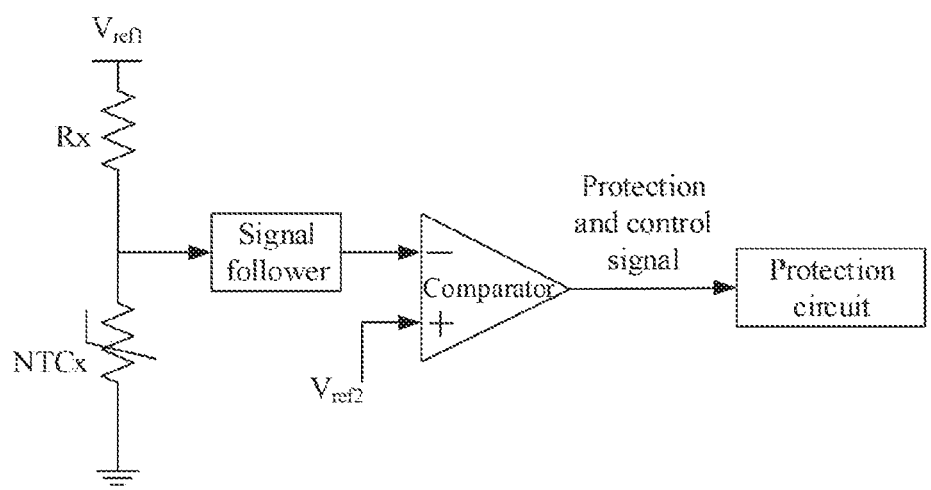
FIG. 2 is a schematic diagram illustratively showing a structure of an over-temperature protection circuit in which the temperature is detected using a Negative Temperature Coefficient (NTC) thermistor.

In the solution shown in FIG. 2, the temperature is detected by a NTC thermistor to realize the temperature protection. In FIG. 2, Vref1 represents a reference voltage value, Rx represents a voltage-division resistor, NTCx represents the thermistor. In the switching power supply, the thermistor NTCx is usually placed near an element which generates a lot of heat, the voltage-division resistor Rx and the thermistor NTCx form a voltage-division network associated with Vref1; the voltage which reflects the temperature obtained by the voltage-division network, after passing a signal follower, is input to a negative terminal of a comparator, and a positive terminal of the comparator receives a reference voltage value Vref2. If the load of the power supply becomes heavy or the ambient temperature rises, the components in the power supply will generate more heat; accordingly, the resistance value of the NTC thermistor goes down as the temperature rises, and the voltage which reflects the temperature and is input to the negative terminal of the comparator goes down. If the voltage which reflects the temperature falls down to lower than Vref2, the comparator outputs a protection control signal of a high level to a protection circuit module which may turn off the switching power supply and the like so as to reduce heat generation amount and thereby control the temperature.

Figure 1:
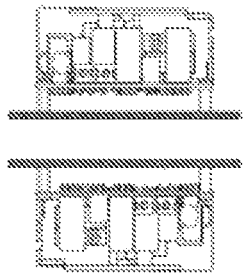
FIG. 1 is a schematic diagram illustratively showing six space installation directions of a switching power supply.
Figure 1:
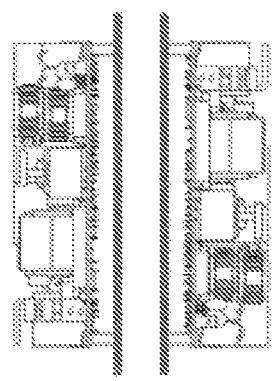
Figure 1:
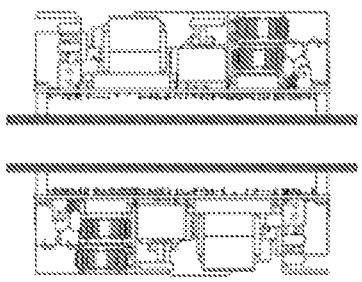

Generally, it is not just one element in a switching power supply that generates a lot of heat, but there usually exist a plurality of heat generation points at the same time, for example, magnetic elements and semiconductor switching devices, and it is not possible to design a temperature detection portion for individual ones of all the heat generation points respectively. As a commonly used approach, only the temperature of the element which has the highest temperature in the switching power supply is detected, and if the installation direction of the switching power supply is known, the temperatures of other elements can be guaranteed under fixed heat dissipation conditions by reasonably designing over-temperature protection, so that the temperature of elements will not exceed their temperature-resistance specifications no matter the switching power supply works under normal conditions or over-temperature protection is triggered due to abnormal conditions such as over-temperature or over load. However, as shown in FIG. 1, if a standard switching power supply is applied in a terminal, the way in which the switching power supply is installed cannot be known. As the installation direction changes, a heat generation point detected by the NTC thermistor which has the highest temperature under fixed conditions may become not having the highest temperature. Usually, use power is defined to meet the requirement that the temperatures of elements under normal working conditions in each installation direction will not exceed the temperature-resistance specifications. For some switching power supply products applied in medical machines, the temperature under abnormal conditions also need to meet element specifications. However, the trigger point for over-temperature protection is fixed. Thus, it is hard to meet the specifications in each installation direction. The deficiency that the power control requirements and the over-temperature protection requirements in each installation direction cannot be met is undoubtedly an application defect for a standard switching power supply. In addition, under natural heat dissipation conditions, the temperatures of electronic elements are seriously influenced by the installation direction, and the existing solutions cannot meet the power control and over-temperature requirements in all installation directions.

Figure 3:
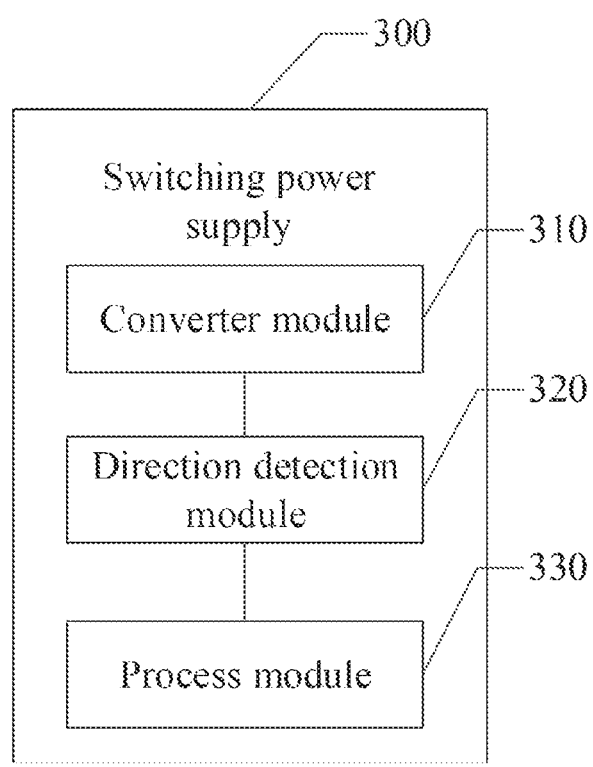
FIG. 3 is a block diagram illustratively showing a switching power supply according to an exemplary embodiment of the present disclosure.

In view of the above, an exemplary embodiment provides a switching power supply. Referring to FIG. 3, the switching power supply includes a converter module 310, a direction detection module 320, and a process module 330.

The converter module 310 includes at least one main power switch.

The direction detection module 320 is configured to acquire installation direction information of the switching power supply.

The process module 330 is configured to perform a preset operation in accordance with the installation direction information of the switching power supply.

In the switching power supply according to the exemplary embodiment, on the one hand, the installation direction information of the switching power supply can be obtained by the direction detection module when the installation direction of the switching power supply changes; on the other hand, the preset operations are performed according the obtained installation direction information, and thus the switching power supply can meet the power control and over-temperature requirements in all installation directions.

It should be noted that, in the exemplary embodiment, the preset operations may include preset operations associated with the over-temperature protection and preset operations associated with the power control, but the preset operations in the exemplary embodiment are not limited to this. For example, the preset operations may further include preset operations associated with the detection of falling own or vibrations and preset operations associated with the process of the installation direction information, which also fall within the scope of the present disclosure.

Figure 4:
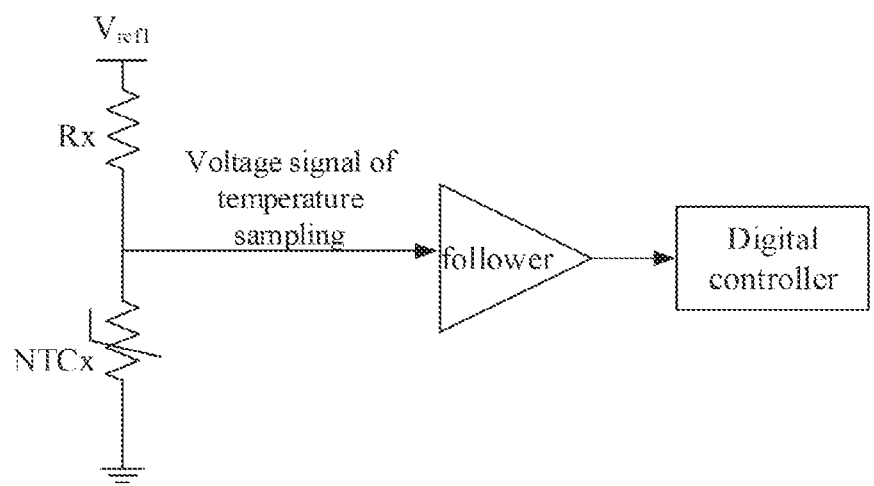
FIG. 4 is a schematic diagram illustratively showing a circuit in which the temperature signal is detected using a thermistor according to an exemplary embodiment of the present disclosure.
Figure 5:
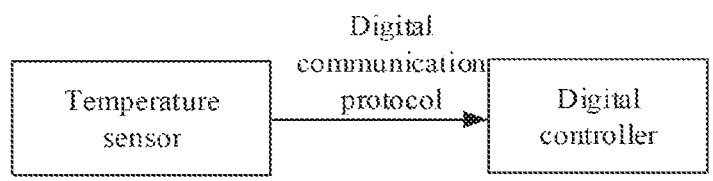
FIG. 5 is a schematic diagram illustratively showing a circuit in which the temperature signal is detected using a digital temperature sensor according to an exemplary embodiment of the present disclosure.

In addition, in the exemplary embodiment, the switching power supply 300 further includes a sampling module in order to detect the temperature of the switching power supply. The sampling module is configured to sample the temperature of a detection point in the switching power supply. FIGS. 4 and 5 illustrates two methods for sampling the temperature of the detection point in the switching power supply, and the obtained temperature sampling information is delivered to a digital controller. i.e., the process module.

FIG. 4 is a schematic diagram illustratively showing a circuit in which the temperature of a detection point is obtained by a thermistor by means of voltage division. As shown in FIG. 4, the thermistor is placed in proximity to a hot point to be detected, and the temperature signal is converted into a voltage signal by the voltage division network. If an analog comparator is used, the protection signal reflecting the temperature can be obtained by comparing the sampled signal in the conventional comparison manner as shown in FIG. 2. In FIG. 4, the subsequent stage of the detection circuit is a digital controller, and the comparator can be conveniently integrated into the digital controller in which logical computations can be conducted. Also, a separate comparator can be used to conduct processes. FIG. 5 shows a method for obtaining the temperature of the detection point using a digital temperature sensor. In FIG. 5, the temperature sensor is placed in proximity to a hot point to be detected, digital information regarding the temperature is obtained, and the temperature information is transmitted to the digital controller as the control information based on a digital communication protocol.

It should be noted that, in the exemplary embodiment, a part of the processes in the process module may be implemented in a digital or analog control manner, and the present disclosure does not impose specific limitations on this. If the process module uses the digital control manner, the process module can be called as a digital controller.

Further, in the exemplary embodiment, the process module, electrically coupled with the sampling module and the direction detection module. In order to conduct over-temperature control on the switching power supply, the process module may include: an inquiry unit configured to obtain a temperature threshold value corresponding to the installation direction information of the switching power supply from a mapping relationship between installation direction information and temperature threshold values; a comparison unit configured to compare the temperature sampled by the sampling module with the temperature threshold value obtained by the inquiry unit; and a communication unit configured to determine whether to start an over-temperature protection based tan comparison result of the comparison unit and send a determination result signal to the converter module.

In addition, in the exemplary embodiment, in order to detect the installation direction of the switching power supply, the direction detection module 310 may include a gravity sensor. By the gravity sensor, the installation direction of the switching power supply 300 can be detected; however, the exemplary embodiment of the present disclosure is not limited to this. For example, the direction detection module 310 may include other direction detection devices such as a gyroscope. Detection of the installation direction of the switching power supply 300 using other direction detection devices also fall within the scope of the present disclosure.

Figure 6:
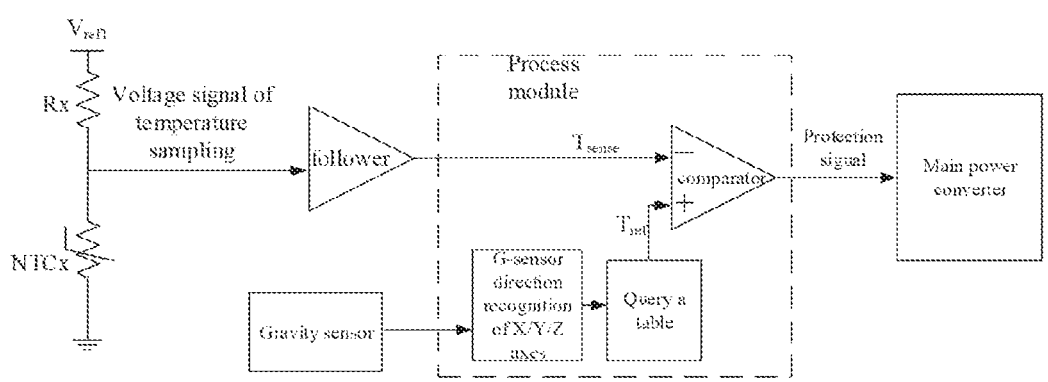
FIG. 6 is a block diagram illustratively showing a control principle in which temperature protection is realized in combination with the installation direction detection according to an exemplary embodiment of the present disclosure.

Further, in the exemplary embodiment, one gravity sensor can be used for detecting the installation direction of the switching power supply. The gravity sensor can be a chip packaged in a surface mounted technology and flatly welded on a surface of a printed circuit board. The gravity sensor may transmit the detected gravity information (i.e., the installation direction) to the process module based on a standard communication protocol. FIG. 6 is a block diagram showing a control approach based on the sampling manner as shown in FIG. 4 in combination with the installation direction detection.

As shown in FIG. 6, a first terminal of the reference resistor Rx is coupled with a first voltage terminal Vref1. A first terminal of the thermistor NTCx is coupled with a second terminal of the reference resistor Rx, and a second terminal of the thermistor NTCx is coupled with a second voltage terminal, for example, a ground terminal. Further, the comparator is integrated into the process module of the switching power supply, and the comparison result can be transmitted to the converter module of the switching power supply via an port of the process module. The gravity sensor is communication with the process module, and can send the sensed X/Y/Z axis information to the process module based on a standard communication protocol.

Figure 7:
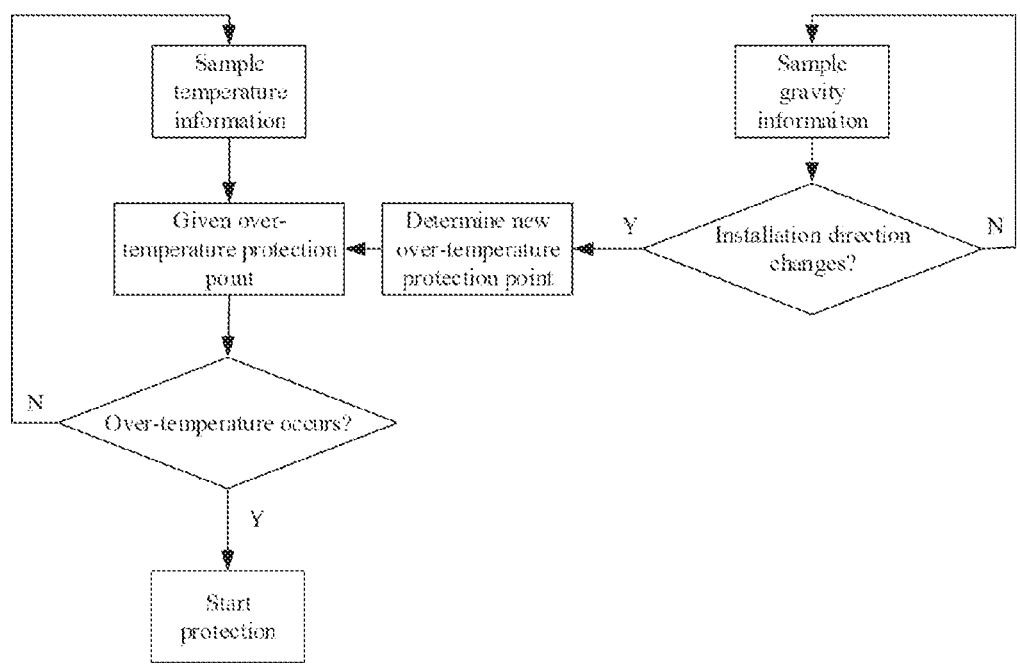
FIG. 7 is a flow chart illustratively showing an over-temperature protection and control method in combination with gravity information detection according to an exemplary embodiment of the present disclosure.

FIG. 7 is a flow chart showing over-temperature protection in combination with the installation direction. In FIG. 7, on the one hand, the temperature signal Tsense sampled from the voltage-division network is transmitted to the process module via a follower, or the temperature signal Tsense sampled by the digital temperature sensor is transmitted to the process module, and the process module receives the temperature signal Tsense sent by the temperature detection circuit via the port; on the other hand, the gravity sensor obtains the direction information regarding six axes (i.e., +X/−X/+Y/−Y/+Z/−Z axes) in which the switching power supply is installed, and transmits the obtained installation direction information to the process module by a standard communication protocol; the process module processes internally the installation direction information regarding the six axes (i.e., the +X/−X/+Y/−Y/+Z/−Z to obtain the actual installation direction of the power supply, and by querying a table which contains preset over-temperature protection information corresponding to different installation directions, the process module obtains the over-temperature protection comparison reference Vref corresponding to the installation direction of the switching power supply at this time, and compares the over-temperature protection comparison reference Vref with the sampled temperature Tsense; if the over-temperature protection comparison reference Vref is greater than the sampled temperature Tsense, it is indicated that the actual sampled temperature exceeds the preset protection temperature, and thus the over-temperature protection is triggered; also, the I/O port of the process module outputs a corresponding protection signal to an over-temperature protection circuit to control on and off of the main power switch of the main power converter.

Thus, if the installation direction of the switching power supply changes, the process module may adjust the over-temperature comparison protection reference according to actual installation direction of the switching power supply, so as to guarantee that components are safe under each installation direction even if an over-temperature situation occurs.

Further, in the exemplary embodiment, the gravity sensor may also sample acceleration information in addition to the direction information. Thus, in order to detect abnormal situations such as the situation that the switching power supply falls down or vibrates, the process module may include a state determination unit configured to determine a motion state of the switching power supply based on acceleration information of the switching power supply detected by the direction detection module. Further, the process module may include a storage unit configured to store at least one of the detected acceleration information and the determined motion state. Moreover, in order to issue prompt information when abnormal situations occur, the process module may include an alarm unit configured to output an alarm signal if the state determination unit determines that the switching power supply is in a falling-down state or a vibration state.

Further, in the exemplary embodiment, the determination of the motion state of the switching power supply includes: determining whether the acceleration information of the switching power supply sensed by the gravity sensor indicates a single-direction acceleration or indicates alternating positive and negative accelerations; determining that the switching power supply is in a falling-down state if it is determined that the acceleration information sensed by the gravity sensor indicates a single-direction acceleration; and determining that the switching power supply vibrates when it is determined that the acceleration information sensed by the gravity sensor indicates alternating positive and negative accelerations. In the exemplary embodiment, the process module farther comprises an alarm unit configured to output an alarm signal if the state determination unit determines that the switching power supply is in a falling-down state or vibration state.

Figure 8:
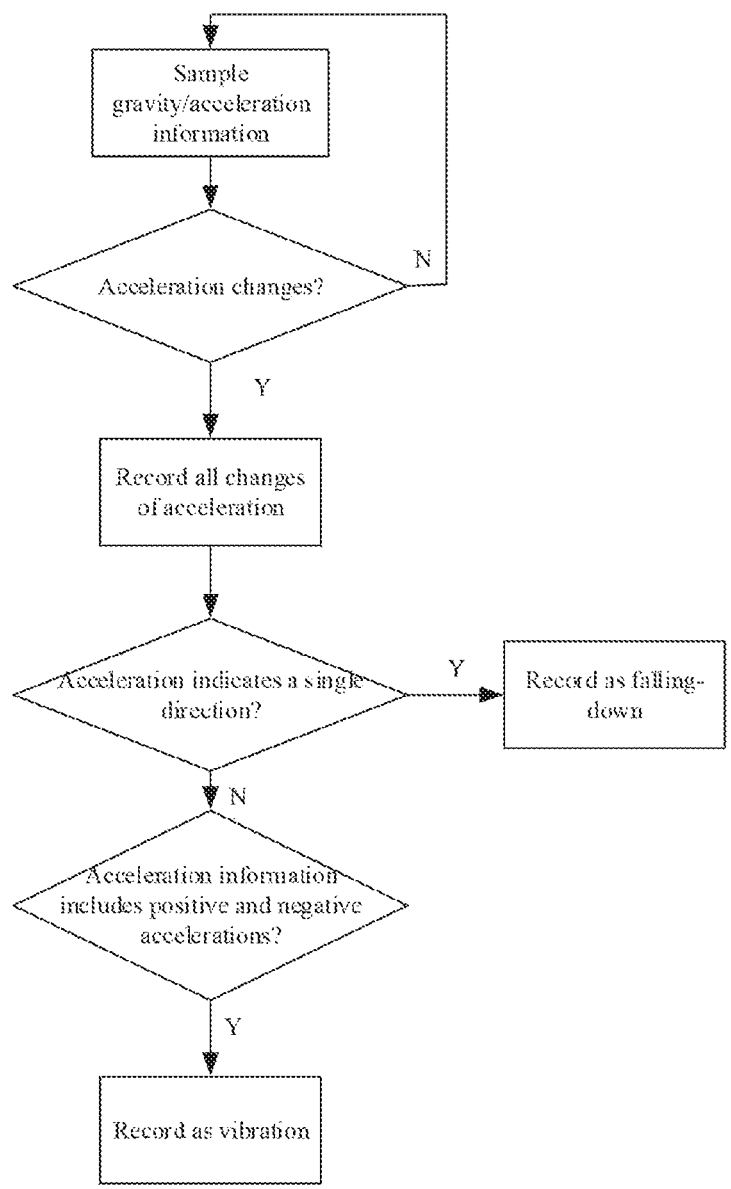
FIG. 8 is a flow chart illustratively showing a method for recording, by a process module, whether a switching power supply is in a falling-down state or a vibration state based on changes of the sampled gravity/acceleration information according to an exemplary embodiment of the present disclosure.

FIG. 8 is a flow chart illustratively showing a method for determining whether the switching power supply is in a falling-down or vibration state based on the changes in the gravity/acceleration information of the switching power supply. As shown in FIG. 8, the gravity/acceleration information of the switching power supply is sampled by the gravity sensor; if the acceleration of the switching power supply changes, the storage unit of the process module can records all the acceleration changes. Next, the motion state of the switching power supply can be determined based on the recorded acceleration changes of the switching power supply. If it is determined that the acceleration information sensed by the gravity sensor indicates a single-direction acceleration, the motion state of the switching power supply can be recorded as a falling-down state; if it is determined that the acceleration information sensed by the gravity sensor includes alternating positive and negative accelerations, the motion state of the switching power supply may be recorded as a vibration state.

Figure 9:
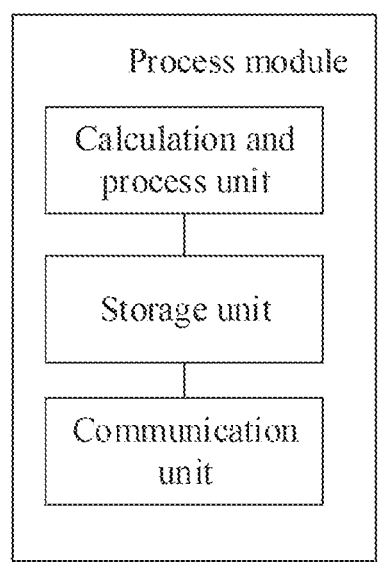
FIG. 9 is a block diagram illustratively showing an internal structure of the process module according to another exemplary embodiment of the present disclosure.

FIG. 9 is a block diagram showing a process module according to another exemplary embodiment of the present disclosure. The process module in FIG. 9 may include a calculation and process unit, a storage unit and a communication unit. The calculation unit may include the above comparison unit and the query unit. In the exemplary embodiment, the process module includes the calculation and process unit to receive information and perform calculation functions, the storage unit may store preset control information and a mapping table of installation direction information and temperature thresholds, and the communication unit can communicate information with the external gravity sensor in real time.

Figure 10:
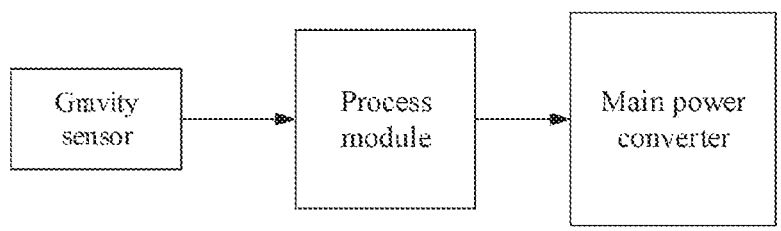
FIG. 10 is a block diagram illustratively showing an auxiliary control structure of a switching power supply including a general gravity sensor according to an exemplary embodiment of the present disclosure.

FIG. 10 is a block diagram showing a flexible control on the switching power supply using the gravity infatuation according to the exemplary embodiment. In FIG. 10, the switching power supply may include a gravity sensor, a process module and a main power converter. The present exemplary embodiment can realize not only the over-temperature protection control, but also adjustment of parameters such as the output power, the output voltage, the output current and the over-voltage protection point (i.e., the temperature threshold value) of the switching power supply based on the gravity information. Further, the gravity sensor may sample the acceleration information in addition to the direction information. Thus, the process module may record and store the motion state of the switching power supply during actual usage of the terminal (the switching power supply is applied in the terminal) and thereby determine whether the switching power has experienced a serious drop or vibration; once the terminal is invalid, the process module may help to analyze the reason for the invalidation of the client.

Figure 11:
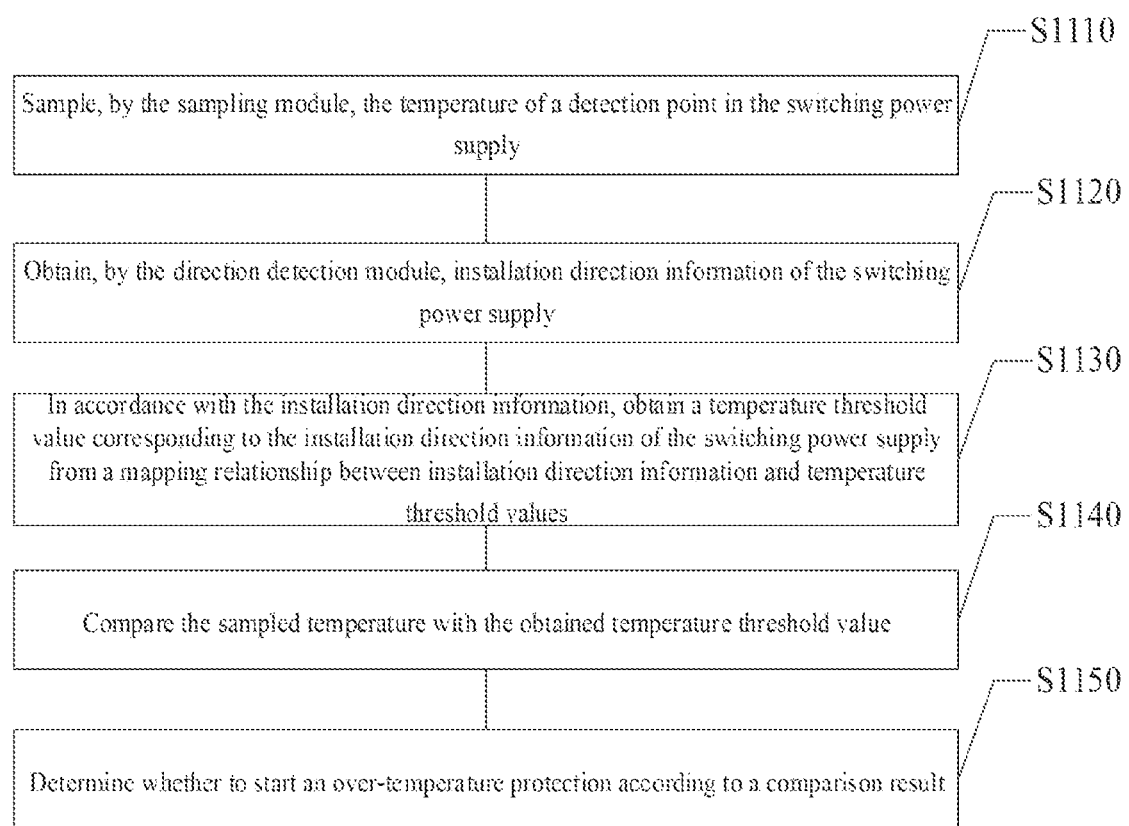
FIG. 11 is a flow chart illustratively showing an over-temperature control and protection method according to an exemplary embodiment of the present disclosure.

An exemplary embodiment of the present disclosure further provide an over-temperature control and protection method, applied in a switching power supply. The switching power supply includes a direction detection module, a sampling module, and a process module. As shown in FIG. 11, the over-temperature control and protection method includes the following steps:

In step S1110, the sampling module samples the temperature of at least one detection point in the switching power supply.

In step S1120, the direction detection module obtains installation direction information of the switching power supply.

In step S1130, a temperature threshold value corresponding to the installation direction information of the switching power supply is obtained from a mapping relationship between installation direction information and temperature threshold values.

In step S1140, the sampled temperature is compared with the obtained temperature threshold value.

In step S1150, whether to start an over-temperature protection is determined according to a comparison result.

In the over-temperature control and protection method according to the exemplary embodiment, the temperature of the at least one detection point in the switching power supply is sampled to obtain the temperature information of the switching power supply in real time; the installation direction of the switching power supply is detected by the direction detection module to obtain the installation direction information of the switching power supply in real time; the temperature threshold corresponding to the obtained installation direction information is obtained, and the sampled temperature is compared with the obtained temperature threshold, and whether to start the over-temperature protection is determined according to the comparison result. Thus, the method can realize safe and reliable over-temperature protection under various installation direction.

The over-temperature control and protection method according to the exemplary embodiment will be described below in detail.

In step S1110, the sampling module samples the temperature of the detection point in the switching power supply.

In the exemplary embodiment, the sampling module may be a digital sampling module, and the sampling module in the exemplary embodiment of the present disclosure is not limited to this, for example, the sampling module may be an analog sampling module, and the present disclosure does not impose specific limitations on this. FIGS. 4 and 5 show temperature sampling in an analog and digital manner, respectively. Because FIGS. 4 and 5 have been described above and repeated descriptions will be omitted here.

Next, in step S1120, the direction detection module obtains installation direction information of the switching power supply.

In the exemplary embodiment, the direction detection module may include a gravity sensor through which the installation direction of the switching power supply is detected, but the exemplary embodiment of the present disclosure is not limited to this. For example, the direction detection module may include other direction detection means such as a gyroscope or the like, and the installation direction of the switching power supply is detected by, the other direction detection means, which is also within the protection range of the present disclosure. In the case that the direction detection module includes a gravity sensor, the gravity sensor can be a chip packaged in a surface mounted form and flatly welded on a surface of a printed circuit board, and transmit the detected gravity information (i.e., the installation direction) to the digital controller based on a standard communication protocol.

Next, in step S1130, the temperature threshold value corresponding to the installation direction information of the switching power supply is obtained from the mapping relationship between installation direction information and temperature threshold values.

In the exemplary embodiment, the table (hereinafter referred to as "mapping relationship table") including the mapping relationship between installation direction information and temperature thresholds may be pre stored in the process module of the switching power supply. As shown in FIG. 7, if the I/O port of the process module receives the temperature signal information Tsense from the temperature detection circuit, the gravity sensor transmit the direction information regarding six axes (i.e., +X/−X/+Y/−Y/+Z/−Z axes) in which the switching power supply is installed to the process module by the standard communication protocol. The process module processes internally the installation direction information regarding the six axes (i.e., the +X/−X/+Y/−Y/+Z/−Z axes) to obtain the actual installation direction of the power supply, and by querying the pre-stored mapping relationship table, the process module obtains the over-temperature protection comparison reference (i.e., the temperature threshold) Vref corresponding to the installation direction of the switching power supply at this time.

Next, in step S1140, the sampled temperature is compared with the obtained temperature threshold value.

In the exemplary embodiment, after the over-temperature protection comparison, reference (i.e. the temperature threshold) Vref corresponding to the installation direction of the switching power supply is determined, the sampled temperature signal Tense is compared with the over-temperature protection comparison reference (i.e., the temperature threshold) Vref.

Next, in step S1150, whether to start the over-temperature protection is determined according to the comparison result.

In the exemplary embodiment, if the temperature threshold Vref is greater than the sampled temperature Tsense, it is indicated that the actual sampled temperature exceeds the preset safety protection temperature, and thus the over-temperature protection is triggered; also, the I/O port of the process module outputs a corresponding protection signal to an over-temperature protection circuit to control on and off of the main power converter. Thus, in the exemplary embodiment, if the installation direction of the switching power supply changes, the process module may adjust the over-temperature comparison protection reference (i.e., the temperature threshold) according to the actual installation direction of the switching power supply, so as to guarantee that components are safe under each installation direction even if an over-temperature situation occurs.

In addition, in the exemplary embodiment, after the over-temperature protection is started, the output power of the switching power supply needs to be controlled. Thus, the over-temperature control and protection method may further include: sending a determination result signal to the converter module of the switching power supply which controls the output power of the switching power supply.

Figure 12:
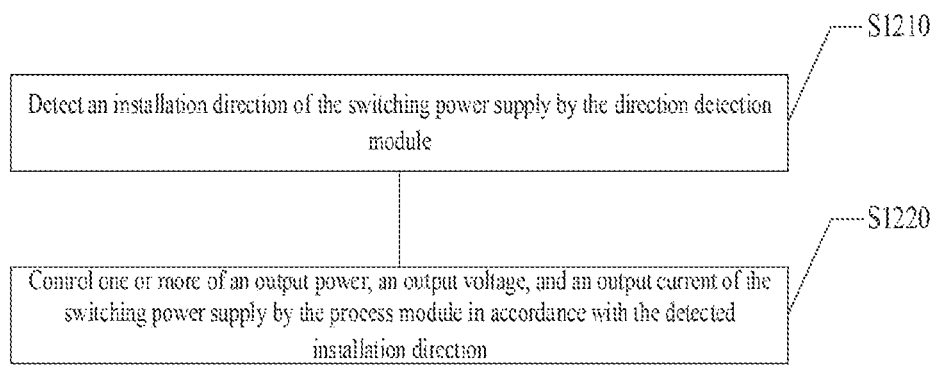
FIG. 12 is a flow chart illustratively showing a power control method according to an exemplary embodiment of the present disclosure.

Further, the present disclosure may also conduct more flexible controls on the switching power supply by using the gravity information in digital control. Thus, an exemplary embodiment of the present disclosure provides a power control method. The power control method may be applied in a switching power supply which includes a direction detection module and a processing module. Referring to FIG. 12, the power control method may include the following steps.

In step 1210, an installation direction of the switching power supply is detected by the direction detection module.

In 1220, one or more of an output power, an output voltage, and an output current of the switching power supply are controlled by the process module in accordance with the detected installation direction.

In the power control method according to the exemplary embodiment, one or more of an output power, an output voltage, and an output current of the switching power supply are controlled by the process module in accordance with the detected installation direction, and thus the output power of the switching power supply may be accordingly controlled under different installation directions. Consequently, the output power, the output voltage or the output current may be optimized under various installation directions.

The power control method according to the exemplary embodiment will be described below in detail.

In step 1210, the installation direction of the switching power supply is detected by the direction detection module.

The detection of the installation direction of the switching power supply in the exemplary embodiment is the same as that described above, and thus repeated descriptions will be omitted here.

In step 1220, one or more of the output power, the output voltage, and the output current of the switching power supply are controlled by the process module in accordance with the detected installation direction.

In the exemplary embodiment, the gravity information may be sampled to conduct more flexible controls on the switching power supply. For example, if the switching power supply has a plurality of installation directions, the maximum output power under each installation direction may vary, and the gravity information may be sampled to restrict the output power according to the current installation direction, thereby avoiding that the output power of the switching power supply exceeds the allowed maximum value. Also, parameters of the switching power supply such as the output voltage, and the output current may be adjusted based on the gravity information, so as to meet specific requirements and realize flexible controls.

Further, in the exemplary embodiment, the power control method may further include:

determining a motion state of the switching power supply based on acceleration information of the switching power supply detected by the direction detection module;

storing at least one of the acceleration information and the motion state.

Further, in the exemplary embodiment, the determination of the motion state of the switching power supply includes:

determining whether the acceleration information of the switching power supply detected by the direction detection module indicates a single-direction acceleration or indicates alternating positive and negative accelerations;

determining that the switching power supply is in a falling-down state if it is determined that the acceleration information detected by the direction detection module is a single direction; and determining that the switching power supply vibrates when it is determined that the acceleration information detected by the direction detection module indicates alternating positive and negative accelerations.

These steps are similar to the determination of falling-down or vibration of the switching power supply described above in connection with FIG. 8, and repeated descriptions will be omitted here.

Further, another exemplary embodiment of the present disclosure provides an electronic apparatus which includes the switching power supply according to any one of the above-described embodiments. The electronic apparatus according to the exemplary embodiment includes the above-described switching power supply, and accordingly, the electronic apparatus has all of the advantages which the switching power supply has.

Other embodiments of the present disclosure will be readily apparent to those skilled in the art upon consideration of the specification and practice of the invention disclosed herein. The present disclosure is intended to cover any variations, uses, or adaptations of the present disclosure that follow the general principles of the present disclosure, and includes the common general knowledge or conventional technical means in the art without departing from the present disclosure. The specification and examples are illustrative only, and the true scope and spirit of the disclosure is defined by the claims.

It should be understood that this disclosure is not limited to the precise constructions described above and shown in the accompanying drawings, and that various modifications and changes may be made without departing from the scope of the present disclosure. The scope of the present disclosure is defined only by the appended claims.

What is claimed is:

1. A switching power supply, comprising:
a converter module comprising at least one main power switch;
a direction detection module configured to obtain installation direction information of the switching power supply; and
a process module configured to perform a preset operation in accordance with the installation direction information of the switching power supply.

2. The switching power supply according to claim 1, farther comprising:
a sampling module configured to sample the temperature of a detection point in the switching power supply;
wherein the process module is electrically coupled with the sampling module and the direction detection module, and the process module comprises:
an inquiry unit configured to obtain a temperature threshold value corresponding to the installation direction information of the switching power supply from a mapping relationship between installation direction information and temperature threshold values;
a comparison unit configured to compare the temperature sampled by the sampling module with the temperature threshold value obtained by the inquiry unit; and
a communication unit configured to determine whether to start an over-temperature protection based on a comparison result of the comparison unit and send a determination result signal to the converter module.

3. The switching power supply according to claim 2, wherein the converter module receives the determination result signal output from the process module and controls the main power switch of the switching power supply.

4. The switching power supply according to claim 2, wherein the sampling module comprises a digital temperature sensor.

5. The switching power supply according to claim 4, wherein the sampling module comprises:
a reference resistor having a first terminal coupled with a first voltage terminal; and
thermistor having a first terminal coupled with a second terminal of the reference resistor and a second terminal coupled with a second voltage terminal.

6. The switching power supply according to claim 1, wherein the direction detection module comprises a gravity sensor.

7. The switching power supply according to claim 1, wherein the process module comprises:
a state determination unit configured to determine a motion state of the switching power supply based on acceleration information of the switching power supply detected by the direction detection module; and a storage unit configured to store at least one, of the acceleration information and the motion state.

8. The switching power supply according to claim 7, wherein the process module further comprises:
an alarm unit configured to output an alarm signal if the state determination unit determines that the switching power supply is in a falling-down state or vibration state.

9. The switching power supply according to claim 7, wherein the direction detection module comprises a gravity sensor and the determination of the motion state of the switching power supply comprises:
determining whether the acceleration information of the switching power supply sensed by the gravity sensor indicates a single-direction acceleration or indicates alternating positive and negative accelerations;
determining that the switching power supply is in a falling-down state if it is determined that the acceleration information sensed by the gravity sensor indicates the single-direction acceleration; and
determining that the switching power supply is in a vibration state if it is determined that the acceleration information sensed by the gravity sensor indicates alternating positive and negative accelerations.

10. An over-temperature control and protection method, applied in a switching power supply, wherein the switching power supply comprises a direction detection module, a sampling module, and a process module, and the over-temperature control and protection method comprises:
sampling, by the sampling module, the temperature of a detection point in the switching power supply;
obtaining, by the direction detection module, installation direction information of the switching power supply;
obtaining a temperature threshold value corresponding to the installation direction information of the switching power supply from a mapping relationship between installation direction information and temperature threshold values;
comparing the sampled temperature with the obtained temperature threshold value; and
determining whether to start an over-temperature protection according to a comparison result.

11. The over-temperature control and protection method according to claim 10, further comprising:
sending the determination result to a converter module, and controlling, by the process module, an output power of the switching power supply.

12. A power control method, applied in a switching power supply, wherein the switching power supply comprises a direction detection module and a processing module, and the power control method comprises:
detecting an installation direction of the switching power supply by the direction detection module; and
controlling one or more of an output power, an output voltage, and an output current of the switching power supply by the process module in accordance with the detected installation direction.

13. The power control method according to claim 12, further comprising:
determining a motion state of the switching power supply based on acceleration information of the switching power supply detected by the direction detection module;
storing at least one of the acceleration information and the motion state.

14. The power control method according to claim 13, wherein the determination of the motion state of the switching power supply comprises:
determining whether the acceleration information of the switching power supply detected by the direction detection module indicates a single-direction acceleration or indicates alternating positive and negative accelerations;
determining that the switching power supply is in a falling-down state if it is determined that the acceleration information sensed by the direction detection module indicates the single-direction acceleration; and
determining that the switching power supply is in, a vibration state if it is determined that the acceleration information sensed by the direction detection module indicates alternating positive and negative accelerations.

* * * * *